(12) United States Patent
Chang et al.

(10) Patent No.: US 12,223,252 B2
(45) Date of Patent: Feb. 11, 2025

(54) THROUGH-SILICON VIA IN INTEGRATED CIRCUIT PACKAGING

(71) Applicant: Taiwan Semiconductor Manufacturing Co., Ltd., Hsinchu (TW)

(72) Inventors: Fong-yuan Chang, Hsinchu (TW); Chin-Chou Liu, Jhubei (TW); Chin-Her Chien, Chung-Li (TW); Cheng-Hung Yeh, Jhunan Township (TW); Po-Hsiang Huang, Tainan (TW); Sen-Bor Jan, Tainan (TW); Yi-Kan Cheng, Taipei (TW); Hsiu-Chuan Shu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 22 days.

(21) Appl. No.: 18/171,072

(22) Filed: Feb. 17, 2023

(65) Prior Publication Data

US 2023/0205967 A1 Jun. 29, 2023

Related U.S. Application Data

(60) Continuation of application No. 17/179,904, filed on Feb. 19, 2021, now Pat. No. 11,586,797, which is a (Continued)

(51) Int. Cl.
*G06F 30/394* (2020.01)
*G06F 30/392* (2020.01)
*G06F 30/398* (2020.01)

(52) U.S. Cl.
CPC .......... *G06F 30/394* (2020.01); *G06F 30/392* (2020.01); *G06F 30/398* (2020.01)

(58) Field of Classification Search
USPC ........................................................ 716/126
See application file for complete search history.

(56) References Cited

U.S. PATENT DOCUMENTS

| 8,198,912 B1 | 6/2012 | Thinakarsn et al. |
| 9,105,490 B2 | 8/2015 | Wang et al. |
| (Continued) | | |

FOREIGN PATENT DOCUMENTS

| CN | 101790846 A | 7/2010 |
| CN | 102479497 A | 5/2012 |
| (Continued) | | |

OTHER PUBLICATIONS

Office Action directed to related Chinese Patent Application No. 201811234496.3, mailed Oct. 9, 2022; 9 pages.

*Primary Examiner* — Bryce M Aisaka
(74) *Attorney, Agent, or Firm* — Sterne, Kessler, Goldstein & Fox P.L.L.C.

(57) ABSTRACT

The present disclosure describes structures and methods for a via structure for three-dimensional integrated circuit (IC) packaging. The via structure includes a middle portion that extends through a planar structure and a first end and a second end each connected to the middle portion and on a different side of the planar structure. One or more of the first end and the second end includes one or more of a plurality of vias and a pseudo metal layer.

20 Claims, 11 Drawing Sheets

Related U.S. Application Data division of application No. 16/460,137, filed on Jul. 2, 2019, now Pat. No. 10,949,597.

(60) Provisional application No. 62/698,758, filed on Jul. 16, 2018.

(56) References Cited

U.S. PATENT DOCUMENTS

| | | |
|---|---|---|
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,199,315 B2 | 2/2019 | Farooq et al. |
| 2005/0077083 A1* | 4/2005 | Mattix .................. H05K 1/115 174/265 |
| 2008/0024172 A1 | 1/2008 | Yu et al. |
| 2011/0304994 A1 | 12/2011 | Mair |
| 2013/0187289 A1 | 7/2013 | Cobbley et al. |
| 2013/0341799 A1* | 12/2013 | Chen .................. H01L 23/481 257/E21.597 |
| 2014/0061936 A1 | 3/2014 | Moroz et al. |
| 2014/0217607 A1 | 8/2014 | Uzoh et al. |
| 2014/0246757 A1* | 9/2014 | Daley .................. G06F 30/394 257/621 |
| 2014/0264739 A1 | 9/2014 | Morrow et al. |
| 2016/0099201 A1 | 4/2016 | Choi et al. |
| 2017/0063580 A1 | 3/2017 | Kireev |
| 2020/0019668 A1 | 1/2020 | Chang et al. |

FOREIGN PATENT DOCUMENTS

| | | |
|---|---|---|
| CN | 104718618 A | 6/2015 |
| CN | 105190875 A | 12/2015 |
| TW | 201816898 A | 5/2018 |

* cited by examiner

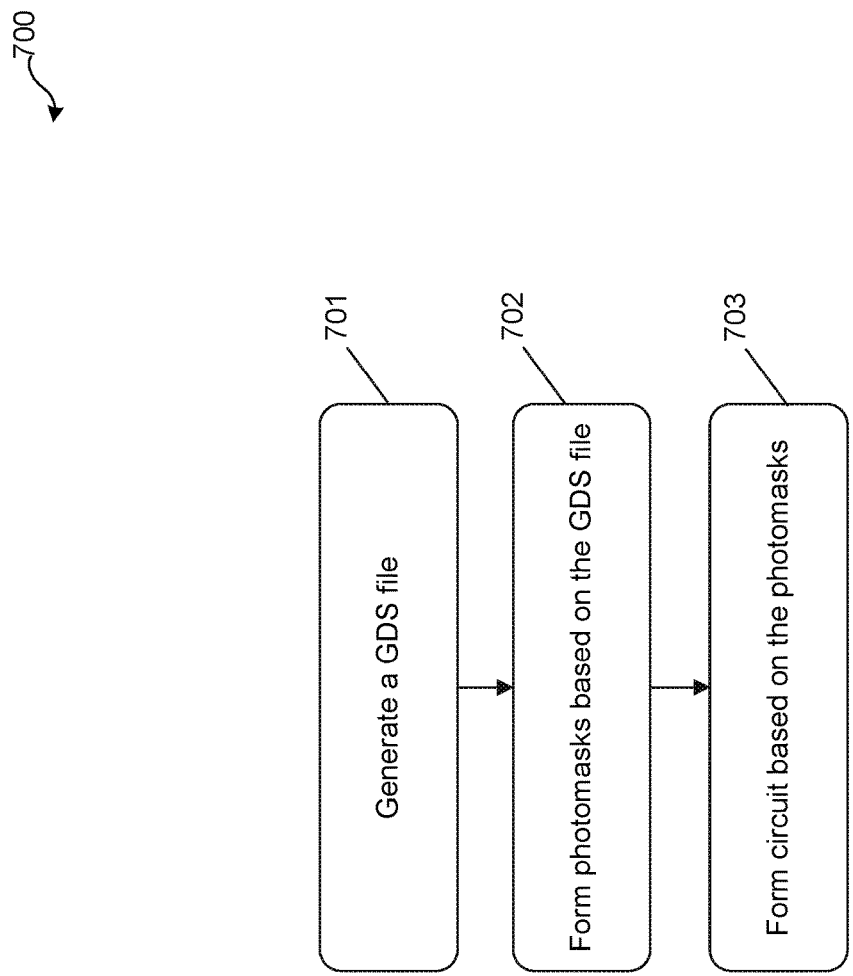

THROUGH-SILICON VIA IN INTEGRATED CIRCUIT PACKAGING

RELATED APPLICATION

This application is a continuation of U.S. patent application Ser. No. 17/179,904, titled "Through-Silicon Vias in Integrated Circuit Packaging," filed Feb. 19, 2021, which is a divisional of U.S. patent application Ser. No. 16/460,137, titled "Through-Silicon Vias in Integrated Circuit Packaging," filed Jul. 2, 2019, which claims the benefit of U.S. Provisional Patent Application No. 62/698,758, filed Jul. 16, 2018, titled "Through-Silicon Vias in Integrated Circuit Packaging," each of which is incorporated by reference herein in its entirety.

BACKGROUND

The semiconductor integrated circuit (IC) industry has experienced exponential growth. In three-dimensional (3D) IC packaging, through-silicon vias (TSVs) can be used to connect ICs/components on opposite sides of a silicon wafer substrate/die (or any suitable planar structure). A TSV is an electrical connection that passes/extends through the silicon wafer substrate/die and connects devices/structures (e.g., metal interconnects) on the opposite sides of the silicon wafer substrate/die.

3D IC packaging can be modeled in IC design tools (e.g., electronic design automation tools (EDA) tools). Design rules applied by the IC design tools can be used to determine whether connection patterns between a TSV and another device/structure (e.g., a metal interconnect) are acceptable. For example, a design rule check (DRC) and/or layout versus schematic (LVS) check can be performed on a circuit layout that includes the TSV to check if any violations to the design rules have been detected. When no violations are detected, the circuit layout can be converted to a corresponding graphic database system (GDS) file for tape-out.

BRIEF DESCRIPTION OF THE DRAWINGS

Aspects of the present disclosure are best understood from the following detailed description when read with the accompanying figures. It is noted that, in accordance with practices in the industry, various features are not drawn to scale. In fact, the dimensions of the various features may be arbitrarily increased or reduced for clarity of illustration and discussion.

FIG. 7 is an illustration of a process to form a circuit layout of a 3D IC packaging based on a graphic database system (GDS) file, according to some embodiments of the present disclosure.

DETAILED DESCRIPTION

Figure 1:
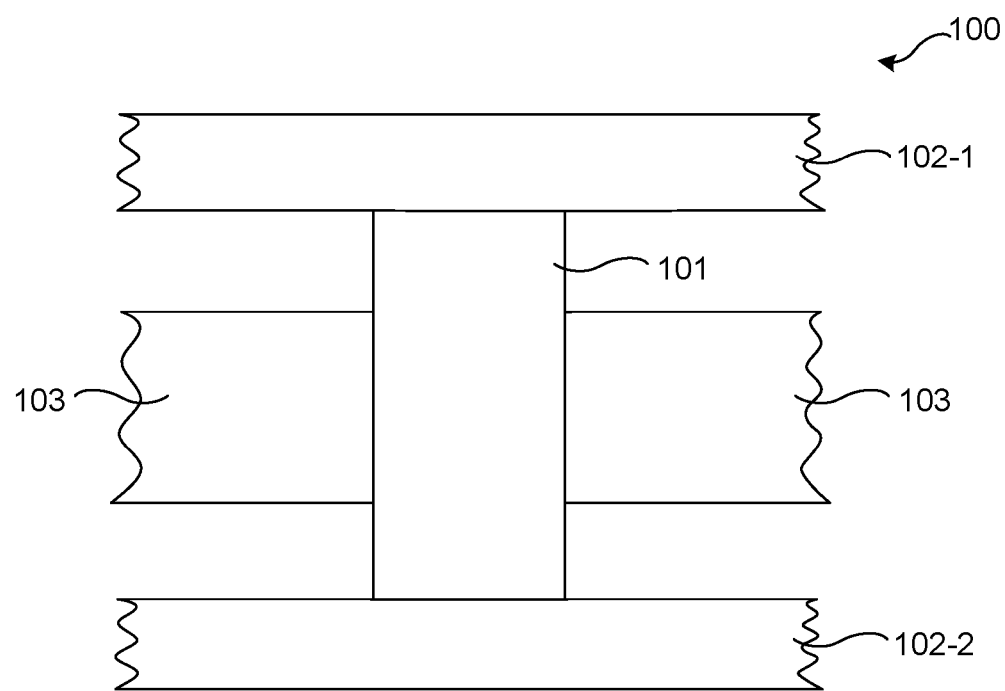
FIG. 1 illustrates a connection pattern of a TSV.

The following disclosure provides many different embodiments, or examples, for implementing different features of the provided subject matter. Specific examples of components and arrangements are described below to simplify the present disclosure. These are merely examples and are not intended to be limiting.

Spatially relative terms, such as "beneath," "underlying," "underneath," "below," "lower," "above," "upper," "lower," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, ±4%, ±5% of the value).

In 3D IC packaging, a TSV can extend through a wafer substrate/die and can be used to connect metal interconnects on both sides of the wafer substrate/die. An EDA tool that designs 3D IC packaging can include design rules to define connection patterns—e.g., connection patterns for TSVs. In the present disclosure, a connection pattern describes the connection(s) formed between interconnect structures (e.g., TSVs) and other structures/devices. The connection pattern can depict the type of connection formed between a TSV and another device/structure. For example, a connection pattern between a TSV and a metal interconnect can be referred as a "via-via" connection pattern. A DRC and/or LVS check can be performed after the formation of connection patterns in a circuit layout to scan for design rule violations and/or circuit verification. Connection patterns can be compared with models (e.g., models defined by the design rules) in the EDA tool to check for design rule violations and can be flagged for correction. The scanning-checking-correction process can be repeated (e.g., using a loop program) until all the connection patterns pass the DRC and/or the LVS check. The circuit layout can then be converted to a GDS file for final tape-out.

A connection between a metal interconnect and a via can be permitted by design rules, and the two ends of a via can each be connected to a metal interconnect. The design rules can prevent (e.g., provide a warning with regard to) a via from being connected to (e.g., in physical contact with) another via. That is, the EDA tool includes the design rules for the connection pattern/model of "metal-via-metal" and does not include the models for the connection pattern of "via-via." For example, the two ends of a TSV can be respectively connected to metal interconnects, and neither of the two ends of a TSV can be connected to other vias. As a result, a connection between a TSV and a via can result in a design rule violation. In the present disclosure, the term "directly connected to" refers to forming direct contact without any structures in between.

FIG. 1 illustrates the model of a connection pattern 100 defined by design rules. Connection pattern 100 includes a TSV connected to two metal interconnects at each end. Connection pattern 100 includes a TSV 101, a wafer substrate/die 103, a first metal interconnect 102-1, and a second metal interconnect 102-2. TSV 101 extends through wafer substrate/die 103 and is connected to first metal interconnect 102-1 and second metal interconnect 102-2 at each end. Connection pattern 100 defines the connection pattern of "first metal interconnect—TSV—second metal interconnect," consistent with the "metal-via-metal" model. Thus, in a circuit layout, a connection pattern with a TSV connected to metal interconnects at both ends can pass DRC and/or LVS check.

However, in IC design, under some circumstances, it is desired that one or more vias can be inserted between a TSV and a metal interconnect instead of directly connecting the TSV and the metal interconnect. For example, a TSV can be formed from a metal material with a particular stiffness, e.g., copper. A direct connection/contact of the TSV and the metal interconnect can cause an undesirably high impact force on the metal interconnect, thus damaging the metal interconnect. A solution to reduce damage to the metal interconnect is to form/insert one or more vias (e.g., smaller and/or softer than the TSV) between the TSV and the metal interconnect to buffer the impact force. That is, the solution includes inserting one or more vias between TSV 101 and first metal interconnect 102-1 and/or between TSV 101 and second metal interconnect 102-2. According to design rules, such connection patterns are not permitted due to lack of definition, thus violating a DRC and/or an LVS check.

The present disclosure provides models for connecting a TSV and a via and the methods for forming these models in an EDA tool for 3D IC packaging. The models can include various extended TSV structures (or via structures) that allow a TSV to be connected to a metal interconnect through vias. The models can be defined, e.g., in the library/database of the EDA tool to expand or supplement current design rules. Accordingly, in 3D IC packaging design, vias smaller than the TSV can be formed/inserted between a TSV and a metal interconnect to, e.g., reduce the impact force and damage to the metal interconnect caused by the TSV. The models defined by the present disclosure can be compatible with current design rules and can allow a "TSV-via" connection pattern in 3D IC packaging. By incorporating the disclosed models in the EDA tool, a circuit layout of 3D IC packaging with TSVs connected to metal interconnects through vias can pass a DRC and/or an LVS check. Accordingly, the metal interconnects can be less susceptible to damages caused by direct contact with TSVs.

Further, the design rules for placement and routing of the connection patterns that are in accordance with the disclosed models are compatible with design rules for placement and routing and can be flexibly incorporated into the EDA tool. Thus, the placement and routing of these connection patterns can be checked using the DRC. Furthermore, the disclosed models and methods can have little dependence on the devices dimensions and can be used in 3D IC packaging of devices of various technology nodes.

In the present disclosure, the term "via" or "vias" can refer to vias different from or smaller than a TSV; and the term "over" can refer to the meaning of "above" or "under." For example, vias connected to one end of a TSV can indicate vias that are smaller than the TSV; and a pseudo metal layer "over" one end of a TSV can refer to the pseudo metal layer being above the upper end of the TSV or under the lower end of the TSV. For illustrative purposes, an example number of vias are shown to describe the embodiments. In various embodiments, the configuration (e.g., number, arrangement, and/or dimensions) of vias can vary.

FIGS. 2A-2D, 3A-3C, and 4A-4B each illustrates an exemplary connection pattern of an extended TSV structure, according to some embodiments. Each of the extended TSV structures can extend through a wafer and/or die at a middle portion of the extended TSV structure. The middle portion can include a TSV. The two ends of the extended TSV structure can respectively be connected to metal interconnects. The extended TSV structures and/or the connection patterns can be defined as models that are consistent with design rules and can be stored in an EDA tool for 3D IC packaging. In a subsequent DRC and/or LVS check, connection patterns (e.g., between a TSV and a metal interconnect) in a circuit layout can be scanned and compared to these models stored in the EDA tool to determine whether the connection patterns are consistent with the design rules and/or the designed schematic. The placement and routing of components in a circuit layout with the disclosed models are compatible with design rules for placement and routing.

FIGS. 2A-2D each illustrates an exemplary connection pattern of a first extended TSV structure, according to some embodiments. The first extended TSV structure can include a TSV and a pseudo metal layer (e.g., an auxiliary metal layer or a dummy metal layer) directly connected together. For simplicity, the end of the first extended TSV structure can be referred to as a "connection end." The first extended TSV structure can be connected to a metal interconnect through one or more vias on the connection end, so that the TSV can be connected to the one or more vias through the pseudo metal layer. The TSV can be directly connected to one side of the pseudo metal layer and the vias can be directly connected to the other side of the pseudo metal layer. In other words, the pseudo metal layer can enable the connection patterns 200-240 (e.g., between a TSV and a metal interconnect) to satisfy the "metal-via-metal" model and pass the DRC and/or LVS check. In some embodiments, in a place-and-route process, a pseudo metal layer can be placed (e.g., by the EDA tool) as a metal layer when being connected to vias. In some embodiments, the pseudo metal layer can be configured as non-connectable to other metal devices/structures in the routing process (e.g., not electrically/conductively connected to the other metal devices/structures). By using the disclosed TSV models in a circuit layout, a TSV can be connected to a metal interconnect through one or more vias.

Figure 2A:
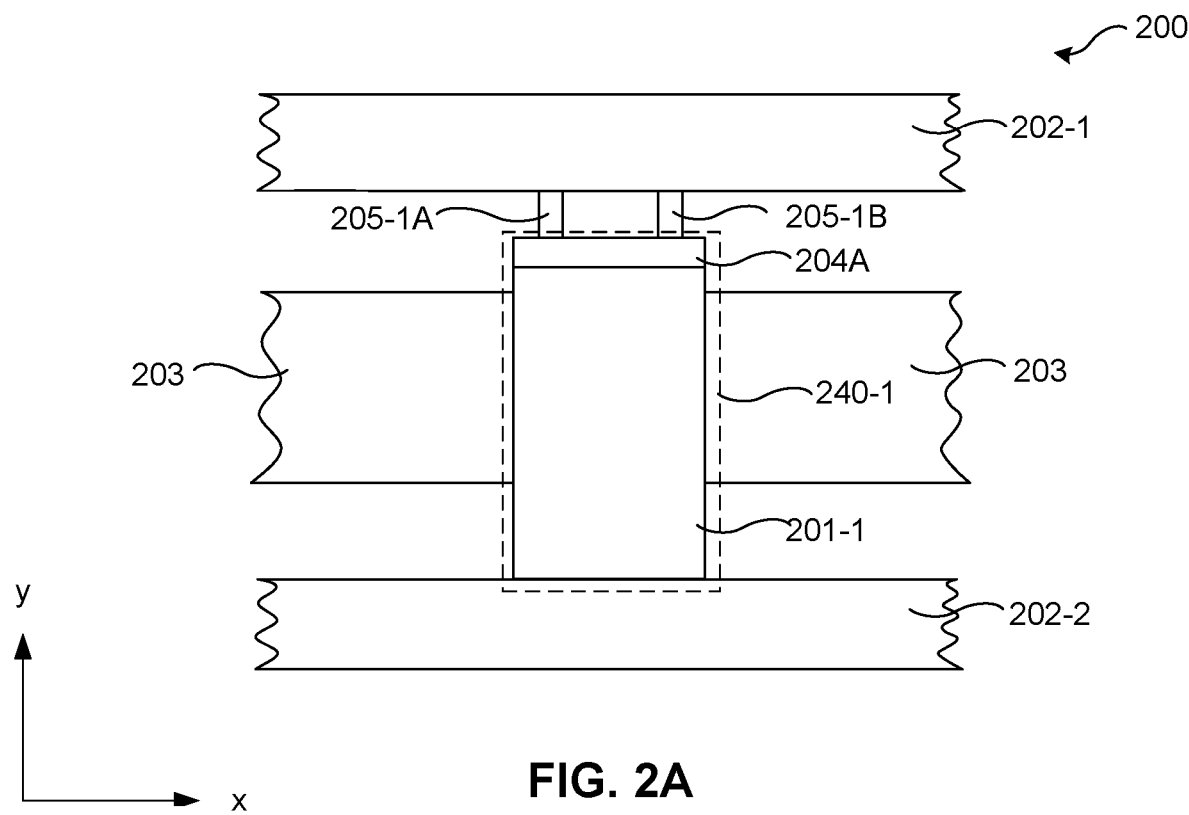
FIGS. 2A-2D each illustrates a connection pattern of an exemplary first extended TSV structure, according to some embodiments of the present disclosure.

FIG. 2A illustrates connection pattern 200 that can include a first extended TSV structure 240-1, according to some embodiments. First extended TSV structure 240-1 (labeled in dashed lines) can include a TSV 201-1 and a pseudo metal layer 204A over an upper end of TSV 201-1. As shown in FIG. 2A, first extended TSV structure 240-1 can extend through wafer substrate/die 203 (or any suitable planar structure) and can be connected to metal interconnects 202-1 and 202-2, respectively. Metal interconnect 202-1 can be over wafer substrate/die 203 and metal interconnect 202-2 can be below wafer substrate/die 203. A lower end of first extended TSV structure 240-1 (e.g., at the bottom of first extended TSV structure 240-1 along the y axis) can be directly connected to metal interconnect 202-2. The upper end (e.g., at the top of TSV along the y-axis) of first extended TSV structure 240-1 can be connected to metal interconnect 202-1 through one or more vias. The vias can be connected to first extended TSV structure 240-1 through pseudo metal layer 204A. For illustrative purposes, two vias 205-1A and 205-1B are shown. In some embodiments, TSV 201-1 can be modeled as a "via." In some embodiments, each of vias 205-1A and 205-1B can be modeled as a "via." In some embodiments, each of metal interconnects 202-1 and 202-2 can be modeled as a "metal" and can be directly connected to TSV 201-1 and/or the one or more vias (e.g., 205-1A and 205-1B).

Connection pattern 200 can satisfy design rules. For example, pseudo metal layer 204A can be modeled (e.g., defined) as "metal" and can be directly connected to TSV 201-1 and vias (e.g., 205-1A and 205-1B). In some embodiments, pseudo metal layer 204A can be modeled as a same type (e.g. "metal") as metal interconnect 202-1 and/or metal interconnect 202-2. In some embodiments, pseudo metal layer 204A can be modeled as a different type from TSV 201-1. For example, pseudo metal layer 204A can be defined as a "metal," while TSV 201-1 can be defined as a "via." In some embodiments, pseudo metal layer 204A can be modeled as a different type from via 205-1 and/or via 205-1B. For example, pseudo metal layer 204A can be defined as a "metal," while via 205-1 and/or via 205-1B can be defined as a "via." In connection pattern 200, the connection of metal interconnect 202-1, vias 205-1A and 205-1B, and pseudo metal layer 204A can satisfy a "metal-via-metal" model, and the connection of pseudo metal layer 204A, TSV 201-1, and metal interconnect 202-2 can satisfy a "metal-via-metal" model. Thus, connection pattern 200 can satisfy the design rules and allow TSV 201-1 to be connected to metal interconnect 202-1 through vias.

Figure 2B:
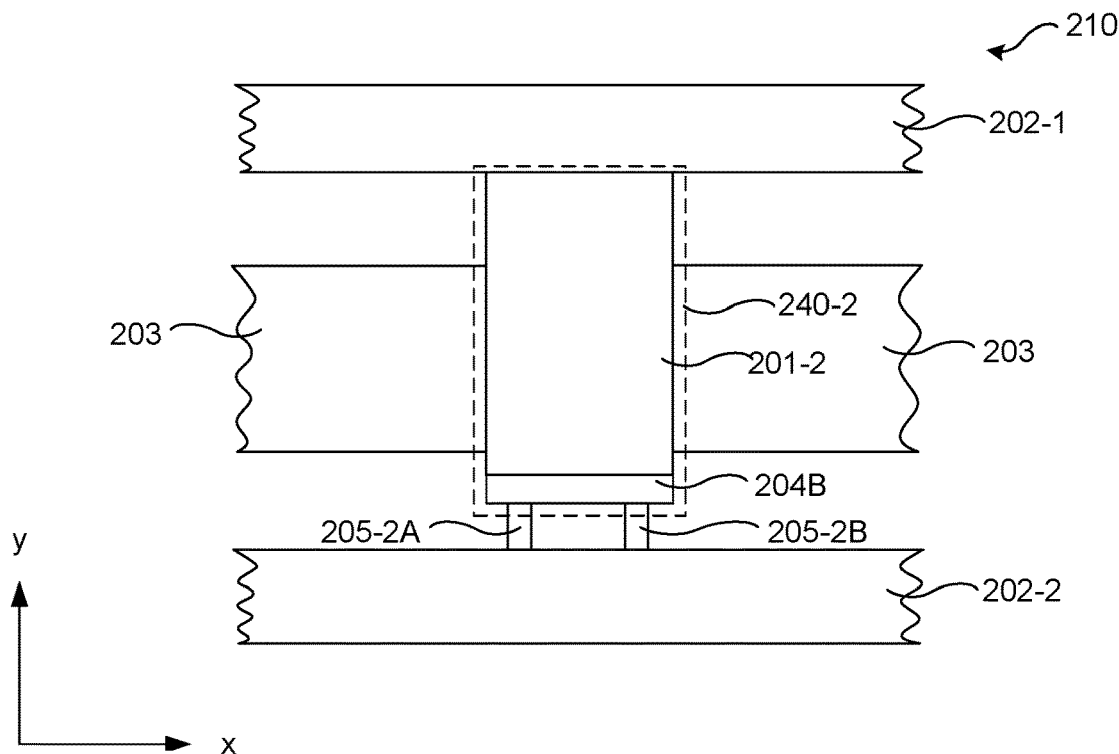

FIG. 2B illustrates connection pattern 210 that can include another first extended TSV structure 240-2, according to some embodiments. First extended TSV structure 240-2 (labeled in dashed lines) can include TSV 201-2 and a pseudo metal layer 204B over a lower end of TSV 201-2. Different from connection pattern 200, in connection pattern 210, first extended TSV structure 240-1 can be connected to metal interconnect 202-2 through one or more vias (e.g., 205-2A and 205-2B) at a lower end of first extended TSV structure 240-1. In first extended TSV structure 240-2, pseudo metal layer 204B can be inserted over the lower end (e.g., along the y axis) of TSV 201-2. The lower end of first extended TSV structure 240-2 can be connected to the vias through pseudo metal layer 204B. The upper end of first extended TSV structure 204-2 can be directly connected to metal interconnect 202-1.

Connection pattern 210 can satisfy the design rules with first extended TSV structure 240-2. For example, pseudo metal layer 204B can be modeled as "metal" and can be directly connected to TSV 201-2 and vias (e.g., 205-2A and 205-2B). For example, in connection pattern 210, metal interconnect 202-1, TSV 201-2, and pseudo metal layer 204B can satisfy a "metal-via-metal" model, and pseudo metal layer 204B, vias 205-2A and 205-2B, and metal interconnect 202-2 can satisfy a "metal-via-metal" model. Thus, connection pattern 210 can satisfy the design rules and allow TSV 201-2 to be connected to metal interconnect 202-2 through vias.

Figure 2C:
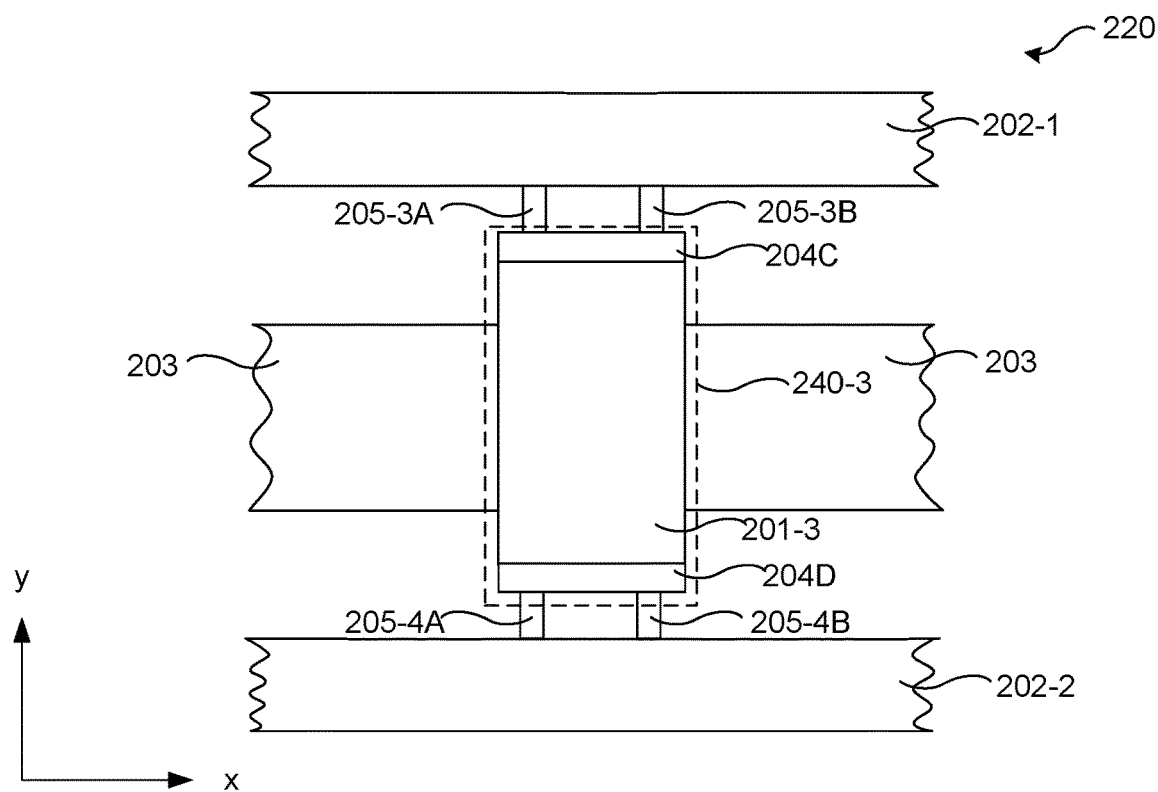

FIG. 2C illustrates connection pattern 220 that can include another first extended TSV structure 240-3, according to some embodiments. First extended TSV 240-3 (labeled in dashed lines) can include TSV 201-3 and pseudo metal layers 204C and 204D over both upper and lower ends of TSV 201-3. Different from connection patterns 200 and 210, in connection pattern 220, first extended TSV structure 240-3 can be connected to both metal interconnects 202-1 and 202-2 through one or more vias (e.g., 205-3A, 205-3B, 205-4A, and 205-4B) at an upper end and a lower end of first extended TSV structure 240-3. First extended TSV structure 240-3 can include pseudo metal layer 204C inserted over the upper end of TSV 201-3, and pseudo metal layer 204D inserted over the lower end of TSV 201-3. First extended TSV structure 240-3 can be connected to vias 205-3A and 205-3B through pseudo metal layer 204C, and connected to vias 205-4A and 205-4B through pseudo metal layer 204D. Vias 205-3A and 205-3B can be further directly connected to metal interconnect 202-1, and vias 205-4A and 205-4B can be further directly connected to metal interconnect 202-2.

Connection pattern 220 can satisfy the design rules with first extended TSV structure 240-3. For example, pseudo metal layers 204C and 204D can each be directly connected to TSV 201-3 and vias (e.g., 205-3A and 205-3B, 205-4A and 205-4B, respectively). In connection pattern 220, metal interconnect 202-1, vias 205-3A and 205-3B, and pseudo metal layer 204C can satisfy a "metal-via-metal" model. Further, pseudo metal layer 204D, vias 205-4A and 205-4B, and metal interconnect 202-2 can satisfy a "metal-via-metal" model. Thus, connection pattern 220 can satisfy the design rules and allow TSV 201-3 to be connected to metal interconnects 202-1 and 202-2 through vias.

Figure 2D:
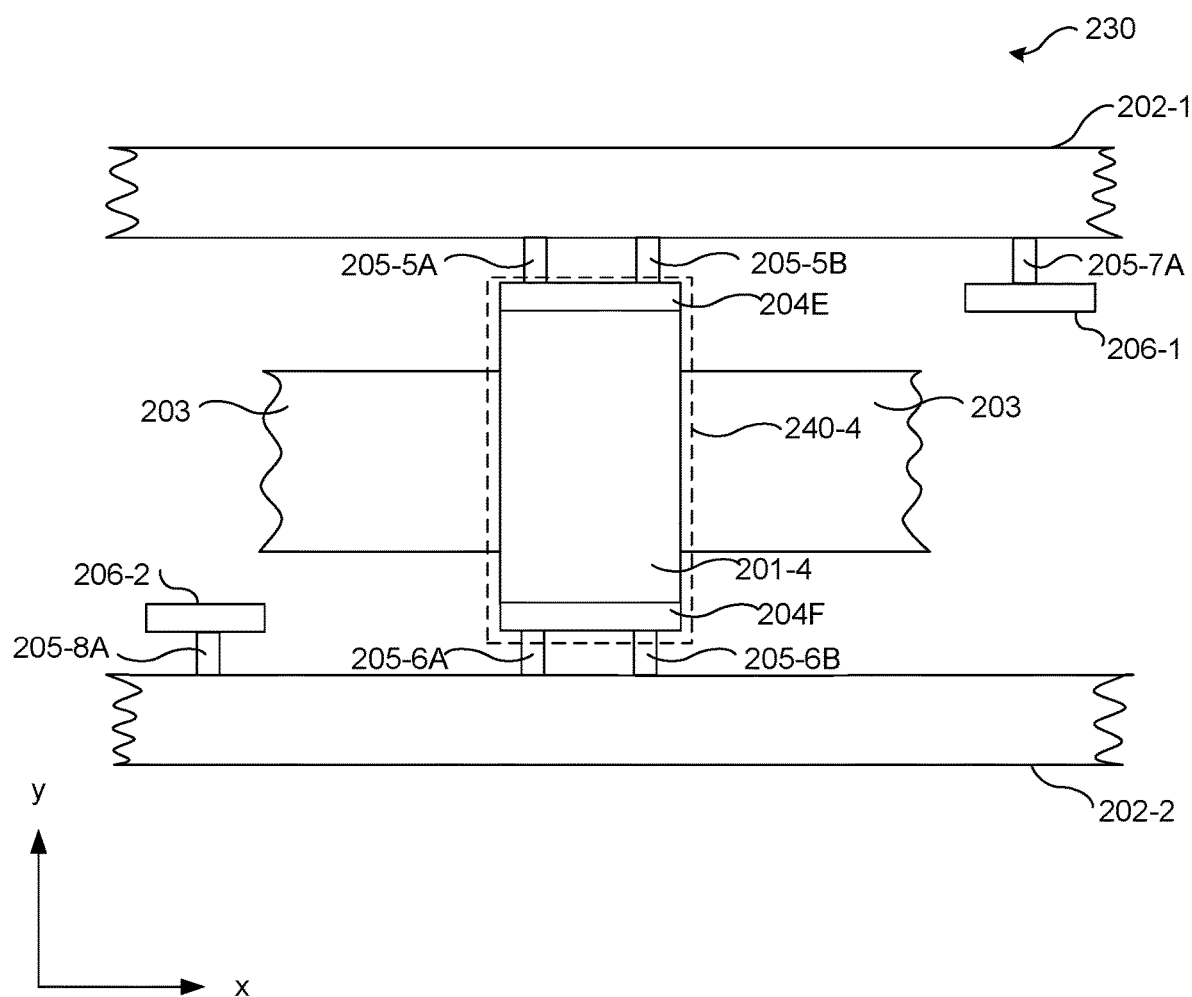

A pseudo metal layer can be different from a metal interconnect or a metal layer. A pseudo metal layer can be defined (e.g., in an EDA tool) to be allowed (e.g., by the design rules) to connect a TSV and vias respectively on each side of the pseudo metal layer, and cannot be connected to other metal layers or metal interconnects in the routing process. FIG. 2D illustrates connection pattern 230 that can include a first extended TSV structure 240-4 and other metal layers/metal interconnects in a place-and-route process, according to some embodiments. In connection pattern 230, first extended TSV structure 240-4 can be the same as or similar to any one of extended TSV structures 200-220 illustrated in FIGS. 2A-2C. For illustrative purposes, first extended TSV structure 240-4 can be the same as first extended TSV structure 240-3 illustrated in FIG. 2C. Pseudo metal layers 204E and 204F can be the same as pseudo metal layers 204C and 204D, respectively; and vias 205-5A, 205-5B, 205-6A, and 205-6B can be the same as vias 205-3A, 205-3B, 205-4A, and 205-4B, respectively. Connection pattern 230 can further include one or more other metal layers/metal interconnects (e.g., 206-1 and 206-2) at the same level (e.g., having the same height along the y-axis) as pseudo metal layer 204E. In an example, metal interconnect 206-1 can be at the same level as pseudo metal layer 204E, and metal interconnect 206-2 can be at the same level as pseudo metal layer 204F. For example, each of metal interconnects 206-1 and 206-2 can have substantially identical thicknesses as each of pseudo metal layers 204E and 204F, respectively. Metal interconnect 206-1 can be connected to metal interconnect 202-1 through via 205-7A that is at a same level as vias 205-5A and 205-5B, and metal interconnect 206-2 can be connected to metal interconnect 202-2 through via 205-8A that is at a same level as vias 205-6A and 205-6B.

As shown in FIG. 2D, pseudo metal layer (e.g., 204E or 204F) can be disconnected from parallel metal interconnects/layers (e.g., metal interconnects/layers having the same height along the y-axis as the pseudo metal layers). In some embodiments, it can be defined in the EDA tool that the pseudo metal layer (e.g., 204E or 204F) is not allowed to connect to any other metal interconnects/layers. For illustrative purposes, two other metal interconnects/layers (e.g., 206-1 and 206-2) at the same level as pseudo metal layers are shown. However, the number of metal interconnects/layers at the same level as pseudo metal layers and the positions of these metal interconnects/layers can vary according to different design requirement and applications.

In designs 200-230 of FIGS. 2A-2D, the configuration (e.g., number, arrangement, and dimensions) of vias between a metal interconnect (e.g., 202-1 or 202-2) and a first extended TSV structure (e.g., 240-1, 240-2, 240-3, or 240-4) can be flexibly determined/defined in the library/database and/or in the circuit layout. For example, the vias can be arranged in a one dimensional pattern or in an array between a metal interconnect and a pseudo metal layer. One via can be separated from another via by a desirable spacing. In some embodiments, the number, arrangement, and/or dimensions of these vias in a library/database and/or circuit layout can be customized to meet different design requirements.

By using the designs/first extended TSV structures provided by FIGS. 2A-2D, a TSV can be connected to metal interconnects through vias, and the configuration (e.g., arrangement, number, and/or dimensions) of vias between an end of the TSV and the connected metal interconnect can be flexibly determined (e.g., adjustable) in the library/database and/or circuit layout to meet different design requirements. In the present disclosure, the term "adjustable" refers to the configuration of vias of the first extended TSV that can be modified after the definition of the first extended TSV. For example, after the first extended TSV is defined to include a 4-by-4 array of vias, the EDA tool can allow the arrangement of the vias to be modified (e.g., automatically or manually) to a 3-by-3 array. Accordingly, a connection between a TSV and a metal interconnect in various 3D IC packaging can be improved/optimized by inserting a suitable number of vias. Thus, metal interconnects can be less susceptible to impact force when contacting with TSVs.

Figure 3A:
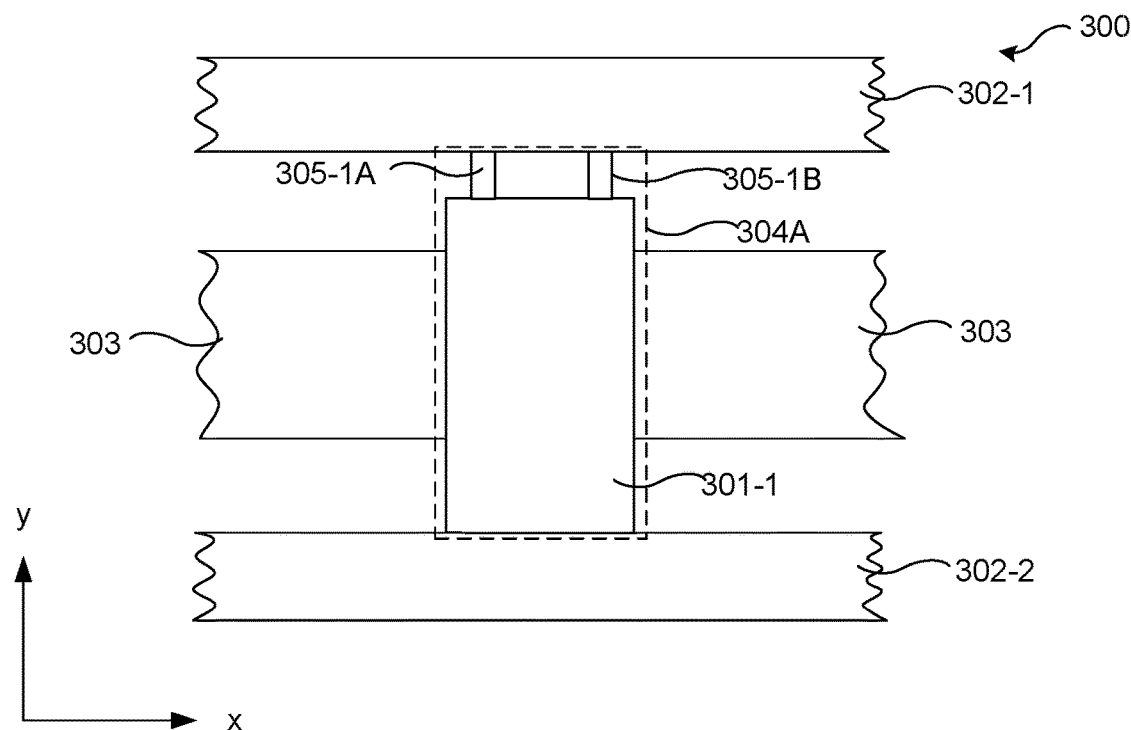
FIGS. 3A-3C each illustrates a connection pattern of an exemplary second extended TSV structure, according to some embodiments of the present disclosure.
Figure 3B:
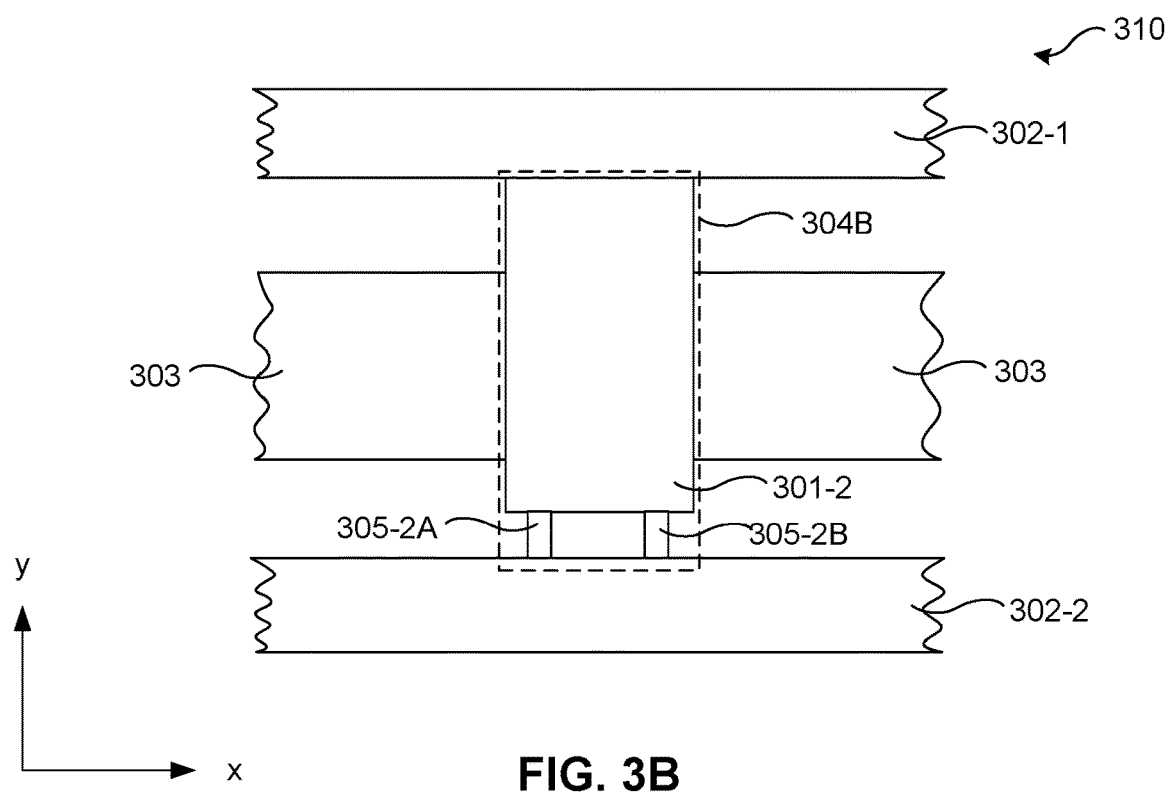
Figure 3C:
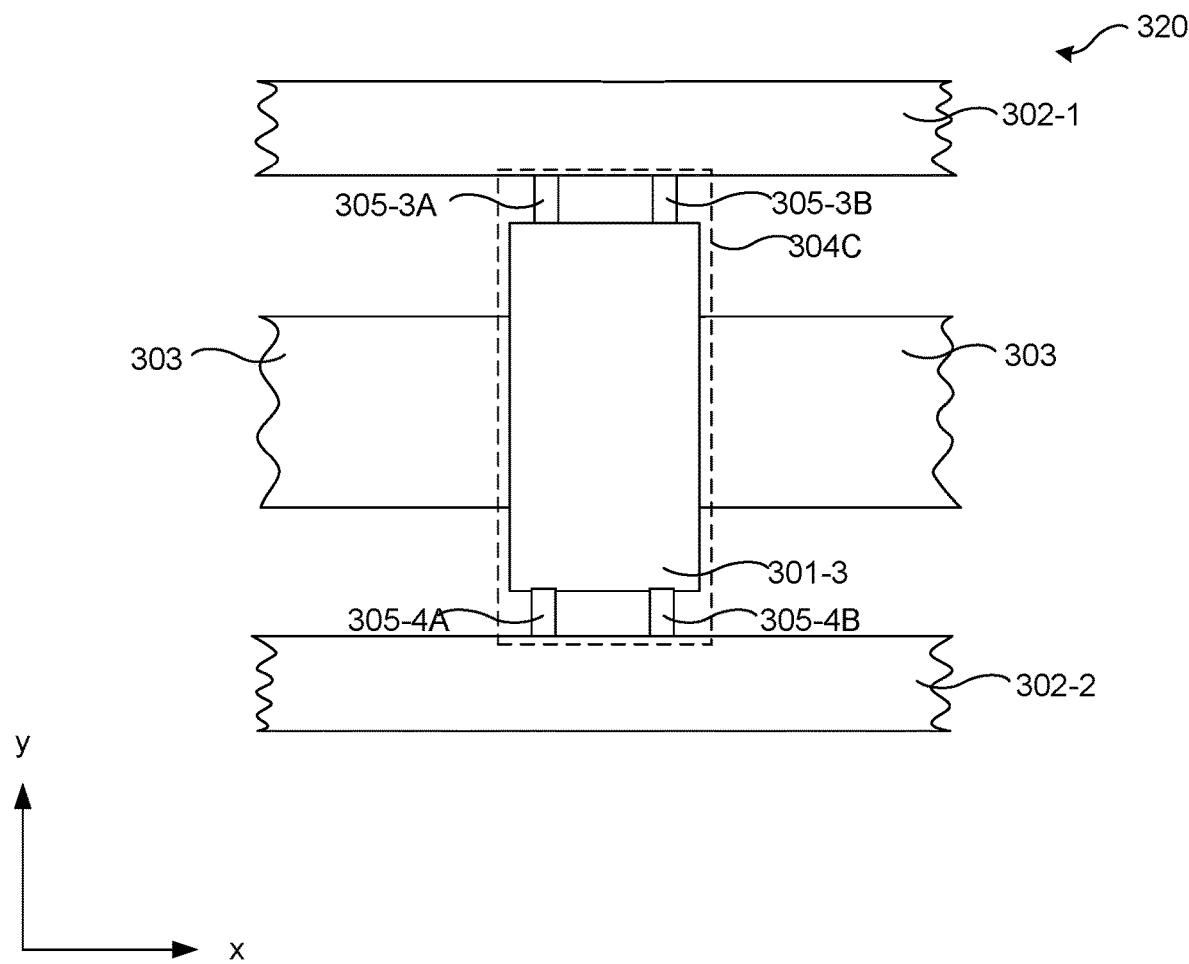

FIGS. 3A-3C each illustrates an exemplary connection pattern of a second extended TSV structure, according to some embodiments. The second extended TSV structure can be directly connected to metal interconnects on each side. The second extended TSV structure can include a TSV and one or more vias directly connected together on at least one end of the TSV. The second extended TSV structure can also be referred to as a "via extended TSV structure" or a "large TSV." The second extended TSV structure can be modeled using a resistance-inductance-capacitance (RLC) model as a single circuit structure. In some embodiments, the single circuit structure has shared electrical properties (e.g., resistance, inductance, and/or resistance), instead of two connected structures each having its own electrical properties. For example, the single circuit structure can be modeled as an RLC sub-circuit, having its own electrical properties (e.g., resistance, inductance, and/or resistance). The modeling can determine the electrical properties of the second extended TSV structure based on its structure/components. Thus, the second extended TSV structure with a different arrangement of vias can be stored (e.g., in a library/database of the EDA tool) and recognized (e.g., by the EDA tool) as different second extended TSV structures. In some embodiments, the arrangement (e.g., number, arrangement, and/or dimensions) of vias in the second extended TSV structure can be fixed/unchanged after the second extended TSV structure is defined. Further, different from the first extended TSV structures illustrated in FIGS. 2A-2D, no pseudo metal layers are needed in second extended TSV structures illustrated in FIGS. 3A-3C. Instead, each of the second extended TSV structures (e.g., as illustrated in FIGS. 3A-3C) can be placed and routed as a single circuit structure (e.g., a via). In some embodiments, the second extended TSV structure can be defined as having the same or similar electrical properties and/or place-and-rout properties as a via, such as being connectable/connected to (e.g., having physical contact with) metal interconnects at the upper and lower ends at the same time and conducting electric current between the connected structures. Metal interconnects 302-1 and 302-2, TSVs 301, and wafer substrate/die 303 in FIGS. 3A-3C can be the same as or similar to metal interconnects 202-1 and 202-2, TSVs 201, and wafer substrate/die 203 in FIGS. 2A-2D.

FIG. 3A illustrates connection pattern 300 that can include a second extended TSV structure, according to some embodiments. Second extended TSV structure 304A (labeled in dashed lines) can include a TSV 301-1 and one or more vias (e.g., 305-1A and 305-1B) directly connected at an upper end of TSV 301-1. In some embodiments, second extended TSV structure 304A can be defined as a "via." In some embodiments, TSV 301-1 and the one or more vias (e.g., 305-1A and 305-1B) connecting to TSV 301-1 can be modeled as a single "via." Second extended TSV structure 304A can be directly connected to metal interconnects at both ends of second extended TSV structure 304A. In some embodiments, vias (e.g., 305-1A and 305-1B) of second extended TSV structure 304A can be directly connected to metal interconnect 302-1 and the upper end (e.g., along the y axis) of TSV 301, and the lower end (e.g., along the y axis) of second extended TSV structure 304A can be directly connected to metal interconnect 302-2. Metal interconnect 302-1 (e.g., can be defined as a "metal"), second extended TSV structure 304A (e.g., can be defined as a "via"), and metal interconnect 302-2 (e.g., can be defined as a "metal") can satisfy a "metal-via-metal" model that is accepted by the design rules.

FIG. 3B illustrates connection pattern 310 that can include another second extended TSV structure, according to some embodiments. Second extended TSV structure 304B (labeled in dashed lines) can include TSV 301-2 and one or more vias (e.g., 305-2A and 305-2B) directly connected at a lower end of TSV 301-2. In some embodiments, second extended TSV structure 304B can be defined as a "via." In some embodiments, TSV 301-2 and the one or more vias (e.g., 305-2A and 305-2B) connecting to TSV 301-2 can be modeled as a single "via." In some embodiments, vias (e.g., 305-2A and 305-2B) of second extended TSV structure 304B can be directly connected to metal interconnect 302-2 and the lower end (e.g., along the y axis) of TSV 301-2, and the lower end of second extended TSV structure 304B can be directly connected to metal interconnect 302-1. Metal interconnect 302-1 (e.g., can be defined as a "metal"), extended TSV structure 304B (e.g., can be defined as a "via"), and metal interconnect 302-2 (e.g., can be defined as a "metal") can satisfy a "metal-via-metal" model that is accepted by the design rules.

FIG. 3C illustrates connection pattern 320 that can include another second extended TSV structure, according to some embodiments. Second extended TSV structure 304C (labeled in dashed lines) can include TSV 301-3 and one or more vias (e.g., 305-3A, 305-3B, 305-4A, and 305-4B) directly connected at an upper end and a lower end of TSV 301-3. In some embodiments, second extended TSV structure 304C can be defined as a "via." In some embodiments, TSV 301-3 and the one or more vias (e.g., 305-3A, 305-3B, 305-4A, and 305-4B) connecting to TSV 301-3 can be modeled as a single "via." In some embodiments, vias (e.g., 305-3A and 305-3B) of second extended TSV structure 304C can be directly connected to metal interconnect 302-1 and the upper end of TSV 301-3, and vias (e.g., 305-4A and 305-4B) can be directly connected to the lower end of TSV 301-3 and metal interconnect 302-2. Metal interconnect 302-1 (e.g., can be defined as a "metal"), extended TSV structure 304C (e.g., can be defined as a "via"), and metal interconnect 302-2 (e.g., can be defined as a "metal") can satisfy a "metal-via-metal" model that is accepted by the design rules.

Different from the first extended TSV structures/designs illustrated in FIGS. 2A-2D, the second extended TSV structures/designs illustrated in FIGS. 3A-3C can have a configuration of vias connected at an end of a TSV that can be static/fixed when second extended TSV structures 304A-304C are defined. In the present disclosure, the term "static" refers to the configuration of vias of the second extended TSV that cannot be modified after the definition of the second extended TSV. For example, after the second extended TSV is defined to include a 4-by-4 array of vias, the EDA tool doesn't allow the arrangement of vias to be modified. To generate a second extended TSV with another arrangement, another second extended TSV with the desired via arrangement (e.g., a 3-by-3 arrangement) can be defined in addition to the second extended TSV with the 4-by-4 arrangement. Because each extended TSV structure can be modeled using a corresponding (e.g., unique) resistance-inductance-capacitance (RLC) model, a second extended TSV structure with a different configuration of vias can correspond to a different RLC model (e.g., for having a different resistance, capacitance, and/or inductance). In some embodiments, second extended TSV structures, each having a different configuration of vias, can be defined using a different RLC model and added into the library/database (e.g., of the EDA tool). These second extended TSV structures can be selected to connect structures/devices (e.g., metal interconnects) at two sides of a wafer/die based on their electrical properties and design requirements. In an example, the library/database can include a plurality of different second extended TSV structures each having vias of a different arrangement (e.g., in a 2-by-2 array and in a 4-by-4 array) and corresponding to different electrical properties. The second extended TSV structures can be selected based on a design circuit layout and/or structures where vias with different configurations are desired.

Figure 4A:
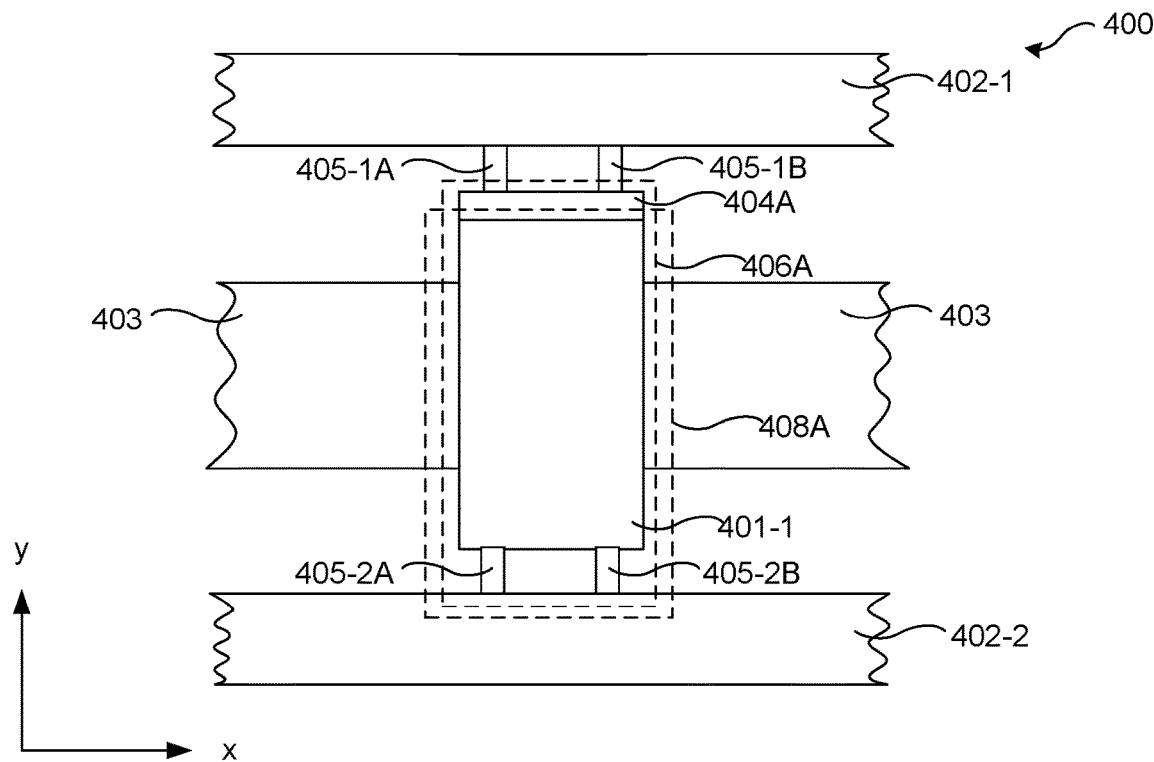
FIGS. 4A and 4B each illustrates a connection pattern of an exemplary third extended TSV structure, according to some embodiments of the present disclosure.
Figure 4B:
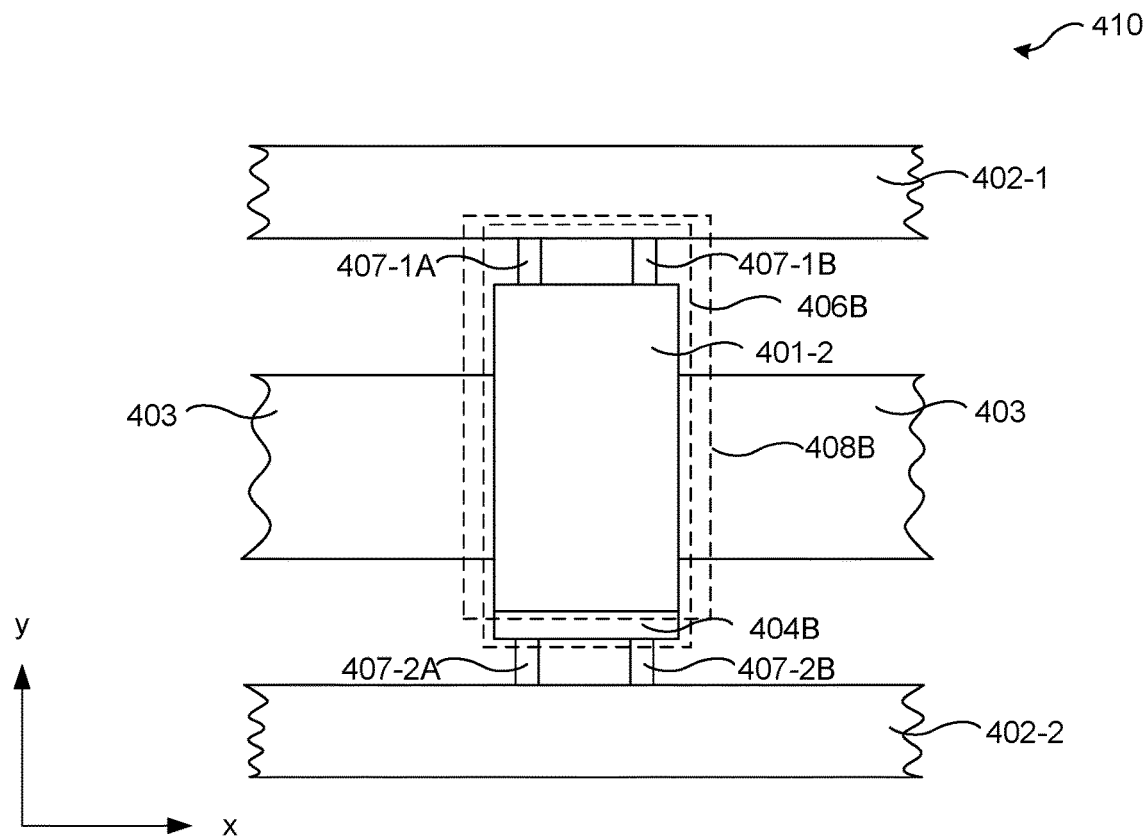

FIGS. 4A and 4B each illustrates an exemplary connection pattern for a third extended TSV structure, according to some embodiments. The third extended TSV structure can be formed by combining a first extended TSV structure illustrated in FIGS. 2A-2D and a second extended TSV structure illustrated in FIGS. 3A-3C. Metal interconnects 402-1 and 402-2, TSV 401, and wafer substrate/die 403 in FIGS. 4A and 4B can be the same as or similar to metal interconnects 202-1/302-1 and 202-2/302-2, TSV 201/301, and wafer substrate/die 203/303 in FIGS. 2A-2D/3A-3C, respectively.

In connection pattern 400 as illustrated in FIG. 4A, third extended TSV structure 406A can include TSV 401-1, a pseudo metal layer 404A directly connected to an upper end (e.g., along the y axis) of TSV 401-1, and one or more vias (e.g., 405-2A and 405-2B) directly connected to a lower end (along the y axis) of TSV 401-1. Third extended TSV structure 406A can further be connected to one or more vias (e.g., 405-1A and 405-1B) through pseudo metal layer 404A. Third extended TSV structure 406A can be connected to metal interconnect 402-1 through vias (e.g., 405-1A and 405-1B) and directly connected to metal interconnect 402-2. As shown in FIG. 4A, third extended TSV structure 406A can also be recognized as a second extended TSV structure 408A (e.g., formed by TSV 401-1 and vias 405-2A and 405-2B) and pseudo metal layer 404A over an upper end of second extended TSV structure 408A. In some embodiments, second extended TSV structure 408A can be defined as a "via." In some embodiments, TSV 401-1 and the one or more vias (e.g., 405-2A and 405-2B) connecting to TSV 401-1 can be modeled as a single "via." Metal interconnect 402-1 (e.g., can be defined as a "metal"), vias 405-1A and 405-1B (e.g., each can be defined as "via"), and pseudo metal layer 404A (e.g., can be defined as a "metal") can satisfy a "metal-via-metal" model. Further, pseudo metal layer 404A (e.g., can be defined as a "metal"), second extended TSV structure 408A (e.g., can be defined as a "via"), and metal interconnect 402-2 (e.g., can be defined as a "metal") can satisfy a "metal-via-metal" model.

In connection pattern 410 as illustrated in FIG. 4B, third extended TSV structure 406B can include TSV 401-2, a pseudo metal layer 404B directly connected to a lower end of TSV 401-2, and one or more vias (e.g., 407-1A and 407-1B) directly connected to an upper end of TSV 401-2. Third extended TSV structure 406B can further be connected to one or more vias (e.g., 407-2A and 407-2B) through pseudo metal layer 404B. Third extended TSV structure 406B can be directly connected to metal interconnect 402-1 and connected to metal interconnect 402-2 through vias (e.g., 407-2A and 407-2B). As shown in FIG. 4B, third extended TSV structure 406B can be recognized as a second extended TSV structure 408B (e.g., formed by TSV 401-2 and vias 407-1A and 407-1B) and pseudo metal layer 404B over a lower end of second extended TSV structure 408B. In some embodiments, second extended TSV structure 408B can be defined as a "via." In some embodiments, TSV 401-2 and the one or more vias (e.g., 407-1A and 407-1B) connecting to TSV 401-2 can be modeled as a single "via." Metal interconnect 402-2 (e.g., can be defined as a "metal"), vias 407-2A and 407-2B (e.g., each can be defined as a "via"), and pseudo metal layer 404B (e.g., can be defined as a "metal") can satisfy a "metal-via-metal" model. Further, pseudo metal layer 404B (e.g., can be defined as a "metal"), second extended TSV structure 408B (e.g., can be defined as a "via"), and metal interconnect 402-1 (e.g., can be defined as a "metal") can satisfy a "metal-via-metal" model.

In some embodiments, the connection patterns and/or extended TSV structures illustrated in FIGS. 2A-2D, 3A-3C, and 4A and 4B can be defined in, e.g., the library/database of the EDA tool to supplement the connection patterns of a TSV (e.g., as connection pattern 100 illustrated in FIG. 1) when vias are desired for connections between the TSV and a metal interconnect in 3D IC packaging designs.

In a library/database and/or circuit layout, the configuration of vias in a second extended TSV structure and in a third extended TSV structure can be fixed/unchanged after they are defined, and the configuration of vias between a metal interconnect and a first extended TSV structure can be flexibly determined/customized to meet various design requirements. Details of the configuration of vias are described above in FIGS. 2A-2D and 3A-3C.

In some embodiments, an extended TSV structure (e.g., first/second/third extended TSV structure) can appear in the library/database as a single circuit structure (e.g., a symbol) without showing the specific configuration of vias, TSV, and/or pseudo metal layer. For example, an extended TSV structure can be distinguished from other extended TSV structures by its electrical properties (e.g., resistance, inductance, and/or capacitance). In 3D IC packaging design, an extended TSV structure can be selected based on its electrical properties and/or design requirements.

Figure 5A:
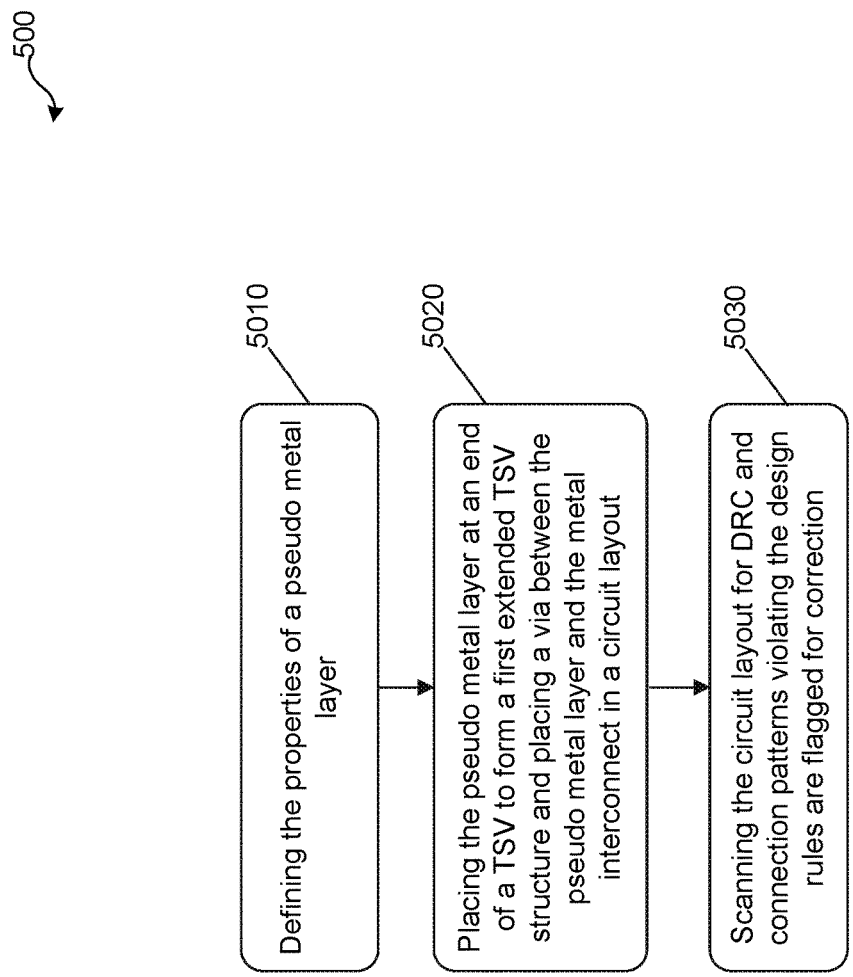
FIGS. 5A-5C each illustrates an exemplary method for forming an extended TSV structure in a circuit layout, according to some embodiments of the present disclosure.
Figure 5B:
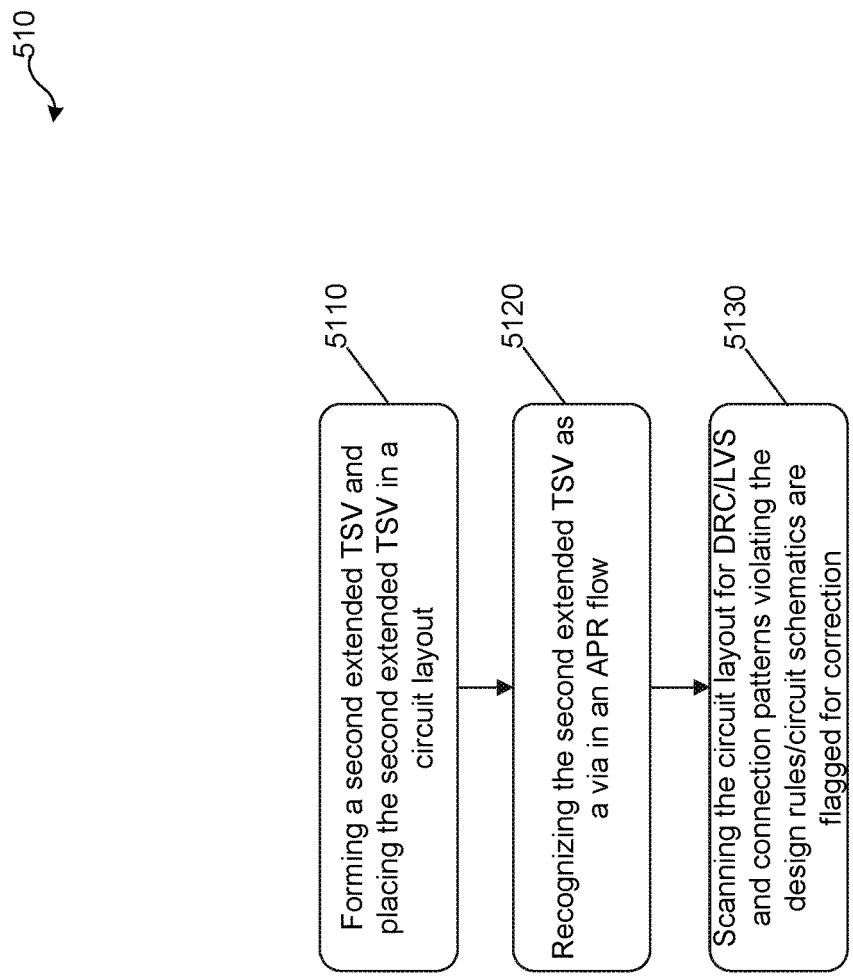
Figure 5C:
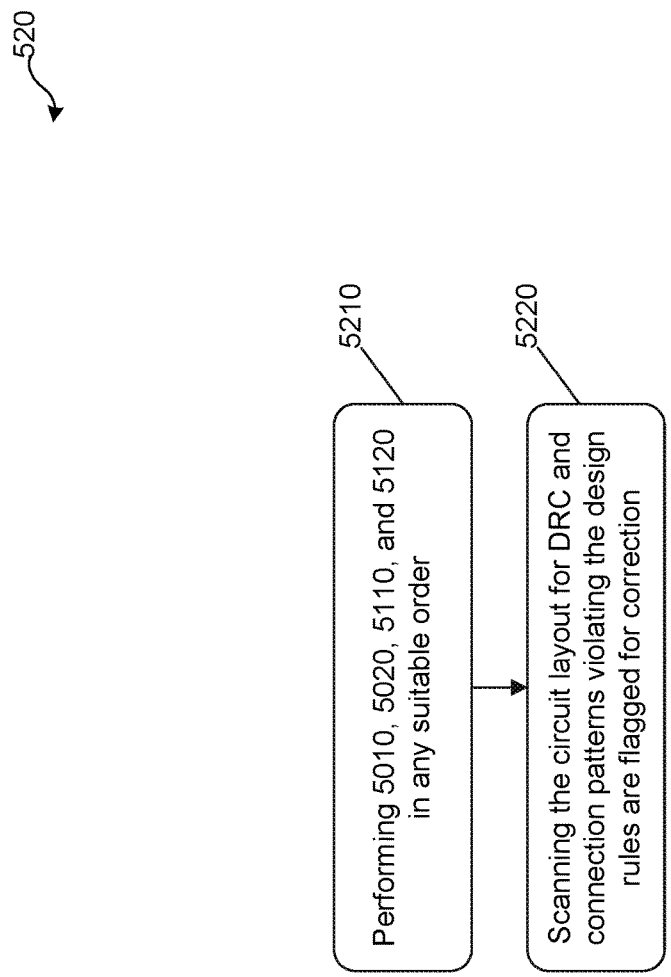

FIGS. 5A-5C illustrate methods to form an extended TSV structure, according to some embodiments. In some embodiments, when the circuit layout shows no design rule violations, the circuit layout can be converted to a GDS file for tape-out. FIG. 5A is an illustration of a method 500 for forming a first extended TSV structure, according to some embodiments. In some embodiments, operations/steps of method 500 can be performed in a different order. Variations of method 500 are within the scope of the present disclosure. Additional details of a first extended TSV structure can be found in the description of FIGS. 2A-2D above.

At operation 5010, a pseudo metal layer is defined in an automatic place and route (APR) database. Properties of the pseudo metal layer can be defined to include, e.g., material properties, dimensions, and electrical properties. In some embodiments, the pseudo metal layer can be defined as a layer to be placed at an end of a TSV and to be connected to one or more vias. In some embodiments, the pseudo metal layer can be defined as a "non-routing layer" and is not to be connected to other metal layers (e.g., or being non-connectable to metal interconnects) in a routing process. In some embodiments, the properties of a via can be defined as being eligible for direct connection (e.g., being connectable) with the pseudo metal layer and one or more metal interconnects. For example, the via can be defined as being connectable to three layers in the routing process. In some embodiments, the one or more metal interconnects can include metal interconnects directly connected to the via on both sides of the via, e.g., metal interconnects of adjacent levels.

At operation 5020, the pseudo metal layer is placed on an end of a TSV in a circuit layout to form a first extended TSV structure and a via is placed between the pseudo metal layer and the metal interconnect in a circuit layout. In some embodiments, operation 5020 can be based on pseudo metal layer being defined as a layer that connects to the TSV and the via. The pseudo metal layer can be automated or can be manually placed. In some embodiments, the circuit layout can be scanned to determine whether the TSV is eligible for direct connection with a pseudo metal layer. For example, an EDA tool can scan and select TSVs having direct connection with one or more metal interconnects.

The EDA tool can check a connection pattern that can include the pseudo metal layer, the TSV, and/or vias. If the connection pattern with the pseudo metal layer, the TSV, and/or vias is compatible with the routing properties of the pseudo metal layer and vias, the pseudo metal layer can be placed on an end of a selected TSV, e.g., between a metal interconnect and the selected TSV. In some embodiments, vias can be placed to connect the pseudo metal layer and the metal interconnect. In some embodiments, the number of vias placed between the pseudo metal layer and the metal interconnect can be flexibly determined based on design requirements. In some embodiments, another via is placed to directly connect the metal interconnect and a metal interconnect of a lower level.

At operation 5030, the circuit layout is scanned for DRC and connection patterns violating the design rules are flagged for correction. Connection patterns compatible with the DRC can be accepted by the EDA tool. In some embodiments, a routing process can be performed after operation 5020 and the circuit layout is scanned for DRC. In some embodiments, unacceptable connection patterns (e.g., connection patterns that violate the design rules) can be flagged for correction. For example, connection patterns with pseudo metal layers being directly connected to other metal layers in the routing process are flagged (e.g., the connection patterns incompatible with DRC can be highlighted in the circuit layout by the EDA tool; the EDA tool can output an alarm voice to indicate the connection pattern incompatible with DRC). The correction to the unacceptable connection patterns can be performed automatically or manually. For example, method 500 can be looped back to operations 5010-5020 to manually or automatically revise the connection patterns. The corrected circuit layout can be scanned for DRC (e.g., using a loop process) until the DRC process is passed for all connection patterns.

FIG. 5B is an illustration of a method 510 for forming a second extended TSV structure, according to some embodiments. In some embodiments, operations/steps of method 510 can be performed in a different order. Variations of method 510 are within the scope of the present disclosure. Additional details of a second extended TSV structure can be found in the description of FIGS. 3A-3C above.

At operation 5110, one or more vias are connected to at least an end of a TSV to form a second extended TSV structure. The second extended TSV structure can be stored in an APR data base and can be placed between metal interconnects in a circuit layout. The EDA tool can check the connection pattern of the vias and directly connect the vias with the TSV and with the metal interconnect if the connection pattern of the vias are compatible with the routing property of the vias. In some embodiments, a suitable number of vias can be determined automatically or manually based on the electrical properties of the formed second extended TSV structure and design requirements. In some embodiments, the number of vias can be fixed after the second extended TSV structure is defined. In some embodiments, the second extended TSV can be defined to have electrical properties, e.g., routing property, as a via. In some embodiments, the second extended TSV structure can be defined as being connectable (e.g., to be directly connected) to metal interconnects at both ends and is routed as a via.

At operation 5120, the second extended TSV structure is recognized as a via in an APR flow, e.g., by the EDA tool. In some embodiments, the second extended TSV structure can be connectable (e.g., to be directly connected) to metal interconnects at both ends and is routed as a via.

At operation 5130, the circuit layout is scanned for DRC/LVS check and connection patterns violating the design rules/circuit schematics are flagged for correction. Connection patterns compatible with the DRC/LVS check can be accepted by the EDA tool. In some embodiments, unacceptable connection patterns (e.g., connection patterns that violate the design rules) can be flagged for correction. For example, connection patterns with pseudo metal layers being connected to other metal layers in the routing process can be flagged. The correction to the unacceptable connection patterns can be performed automatically or manually. The corrected circuit layout can be scanned for DRC/LVS check (e.g., using loop process) until the DRC/LVS check process is passed for all connection patterns.

FIG. 5C is an illustration of a method 520 for forming a third extended TSV structure, according to some embodiments. In some embodiments, operations/steps of method 520 can be performed in a different order. Variations of method 520 are within the scope of the present disclosure. Details of a third extended TSV structure can be found in the description of FIGS. 4A and 4B above.

At operation 5210, a third extended TSV structure is formed by performing operations 5010, 5020, 5110, and 5120 in any suitable order. For example, the third extended TSV can be formed by first forming a first extended TSV and then attaching/connecting a plurality of vias to the end of the TSV that is not connected to a pseudo metal layer. Accordingly, operations 5010 and 5020 can be performed before operations 5110 and 5120. In another example, the third extended TSV can be formed by first forming a second extended TSV and then attaching/connecting a pseudo metal layer to the end of the TSV that is not connected to vias that form the second extended TSV. Accordingly, operations 5110 and 5120 can be performed before operations 5010 and 5020. In some embodiments, the vias and the pseudo metal layer are directly connected to the same TSV to form the third extended TSV. At operation 5220, the circuit layout is scanned for DRC and connection patterns violating the design rules are flagged for correction, similar to operations 5030 and 5130.

Figure 6:
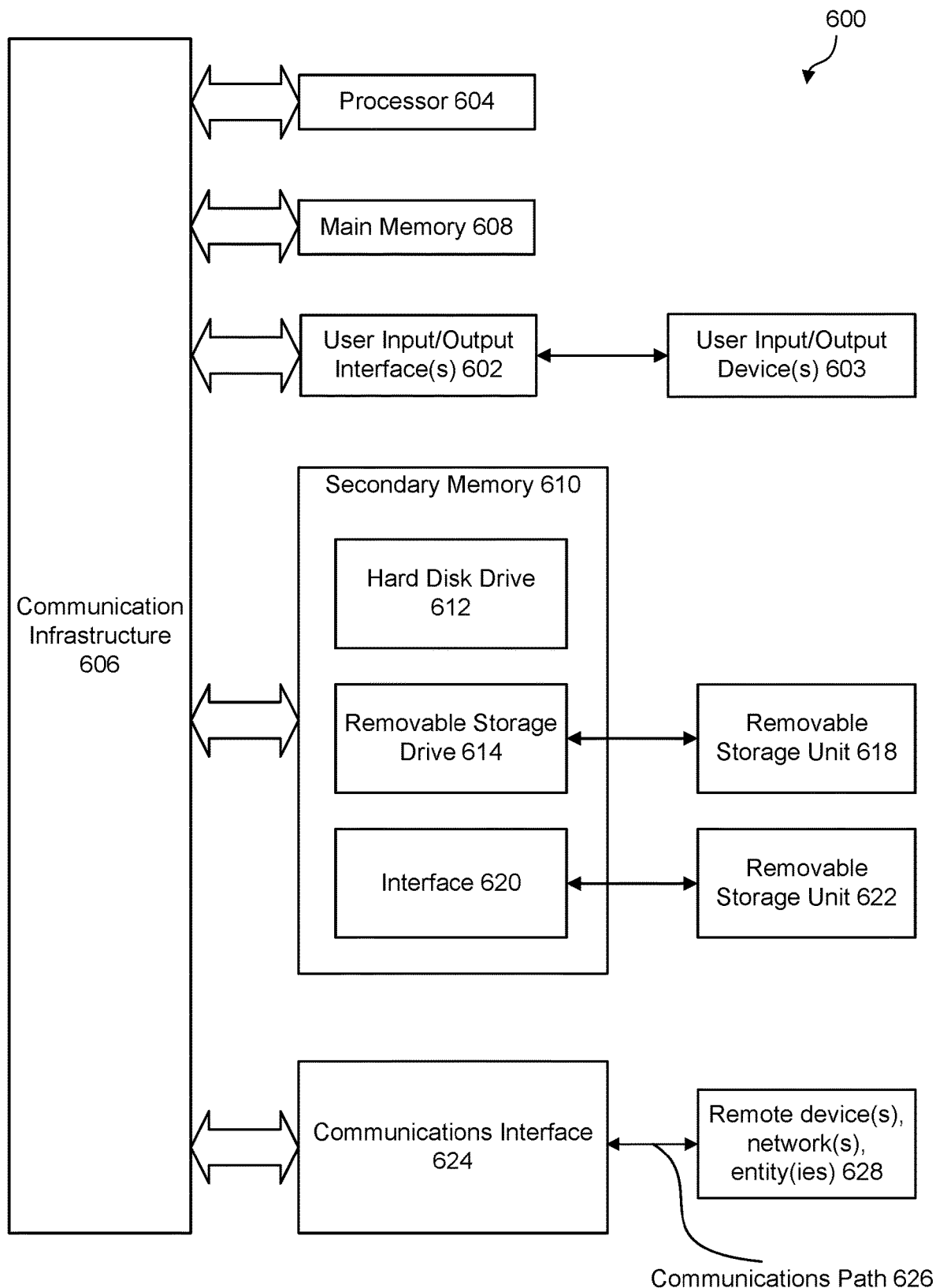
FIG. 6 is an illustration of an exemplary computer system for implementing various embodiments of the present disclosure.

FIG. 6 is an illustration of an example computer system 600 in which various embodiments of the present disclosure can be implemented, according to some embodiments. Computer system 600 can be any well-known computer capable of performing the functions and operations described herein. For example, and without limitation, computer system 600 can be capable of selecting standard cells to be optimized and placing metal cuts at desired locations in the standard cells, for example, an EDA tool. Computer system 600 can be used, for example, to execute one or more operations in methods 500-520, which describe example methods for forming extended TSV structures.

Computer system 600 includes one or more processors (also called central processing units, or CPUs), such as a processor 604. Processor 604 is connected to a communication infrastructure or bus 606. Computer system 600 also includes input/output device(s) 603, such as monitors, keyboards, pointing devices, etc., that communicate with communication infrastructure or bus 606 through input/output interface(s) 602. An EDA tool can receive instructions to implement functions and operations described herein—e.g., methods 500-520 of FIGS. 5A-5C-via input/output device(s) 603. Computer system 600 also includes a main or primary memory 608, such as random access memory (RAM). Main memory 608 can include one or more levels of cache. Main memory 608 has stored therein control logic (e.g., computer software) and/or data. In some embodiments, the control logic (e.g., computer software) and/or data can include one or more of the operations described above with respect to method s 500-520 of FIGS. 5A-5C.

Computer system 600 can also include one or more secondary storage devices or memory 610. Secondary memory 610 can include, for example, a hard disk drive 612 and/or a removable storage device or drive 614. Removable storage drive 614 can be a floppy disk drive, a magnetic tape drive, a compact disk drive, an optical storage device, tape backup device, and/or any other storage device/drive.

Removable storage drive 614 can interact with a removable storage unit 618. Removable storage unit 618 includes a computer usable or readable storage device having stored thereon computer software (control logic) and/or data. Removable storage unit 618 can be a floppy disk, magnetic tape, compact disk, DVD, optical storage disk, and/any other computer data storage device. Removable storage drive 614 reads from and/or writes to removable storage unit 618 in a well-known manner.

According to some embodiments, secondary memory 610 can include other means, instrumentalities or other approaches for allowing computer programs and/or other instructions and/or data to be accessed by computer system 600. Such means, instrumentalities or other approaches can include, for example, a removable storage unit 622 and an interface 620. Examples of the removable storage unit 622 and the interface 620 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 610, removable storage unit 618, and/or removable storage unit 622 can include one or more of the operations described above with respect to methods 500-520 of FIGS. 5A-5C.

Computer system 600 can further include a communication or network interface 624. Communication interface 624 enables computer system 600 to communicate and interact with any combination of remote devices, remote networks, remote entities, etc. (individually and collectively referenced by reference number 628). For example, communication interface 624 can allow computer system 600 to communicate with remote devices 628 over communications path 626, which can be wired and/or wireless, and which can include any combination of LANs, WANs, the Internet, etc. Control logic and/or data can be transmitted to and from computer system 600 via communication path 626.

The operations in the preceding embodiments can be implemented in a wide variety of configurations and architectures. Therefore, some or all of the operations in the preceding embodiments—e.g., methods 500-520 of FIGS. 5A-5C and method 700 of FIG. 7 (described below)—can be performed in hardware, in software or both. In some embodiments, a tangible apparatus or article of manufacture including a tangible computer useable or readable medium having control logic (software) stored thereon is also referred to herein as a computer program product or program storage device. This includes, but is not limited to, computer system 600, main memory 608, secondary memory 610 and removable storage units 618 and 622, as well as tangible articles of manufacture embodying any combination of the foregoing. Such control logic, when executed by one or more data processing devices (such as computer system 600), causes such data processing devices to operate as described herein. In some embodiments, computer system 600 is installed with software to perform operations in the manufacturing of photomasks and circuits, as illustrated in method 700 of FIG. 7 (described below). In some embodiments, computer system 600 includes hardware/equipment for the manufacturing of photomasks and circuit fabrication. For example, the hardware/equipment can be connected to or be part of element 628 (remote device(s), network(s), entity(ies) 628) of computer system 600.

FIG. 7 is an illustration of an exemplary method 700 for circuit fabrication, according to some embodiments. In some embodiments, operations/steps of method 700 can be performed in a different order. Variations of method 700 are within the scope of the present disclosure.

In operation 701, a GDS file is provided. The GDS file can be generated by an EDA tool and include extended TSV structures based on the present disclosure. The operation depicted in 701 can be performed by, for example, an EDA tool that operates on a computer system, such as computer system 600 described above.

In operation 702, photomasks are formed based on the GDS file. In some embodiments, the GDS file provided in operation 701 can be taken to a tape-out operation to generate photomasks for fabricating one or more integrated circuits. In some embodiments, a circuit layout included in the GDS file can be read and transferred onto a quartz or glass substrate to form opaque patterns that correspond to the circuit layout. The opaque patterns can be made of, for example, chromium or other suitable metals. Operation 702 can be performed by a photomask manufacturer, where the circuit layout is read using a suitable software tool (e.g., an EDA tool) and the circuit layout is transferred onto a substrate using a suitable printing/deposition tool. The photomasks reflect the circuit layout/features included in the GDS file.

In operation 703, one or more circuits are formed based on the photomasks generated in operation 702. In some embodiments, the photomasks can be used to form patterns/structures of the circuit contained in the GDS file. In some embodiments, various fabrication tools (e.g., photolithography equipment, deposition equipment, and etching equipment) are used to form features of the one or more circuits on a semiconductor wafer.

In some embodiments, a via structure includes a middle portion that extends through a planar structure and a first end and a second end each connected to the middle portion and on a different side of the planar structure. One or more of the first end and the second end includes one or more of a plurality of vias and a pseudo metal layer.

In some embodiments, a method for forming an extended TSV structure, includes connecting one or more of a pseudo metal layer and a plurality of vias to an end of a TSV to form the extended TSV structure and defining routing properties of the one or more of the pseudo metal layer and the plurality of vias. A routing property of the pseudo metal layer can include being non-connectable to an interconnect and a routing property of the plurality of vias can include being connectable to the pseudo metal layer, the TSV, and the interconnect. The method can further include, in response to a connection pattern of the pseudo metal layer and the plurality of vias being compatible with respective routing properties, connecting the end of the extended TSV structure to the interconnect.

In some embodiments, a non-transitory computer-readable medium containing computer-executable program for, when being executed by a processor, implementing a method for forming an extended TSV structure in 3D IC packaging. The method can include connecting one or more of a pseudo metal layer and a plurality of vias to an end of a TSV to form the extended TSV structure and defining routing properties of the one or more of the pseudo metal layer and the plurality of vias. A routing property of the pseudo metal layer can include being non-connectable to an interconnect and a routing property of the plurality of vias can include being connectable to the pseudo metal layer, the TSV, and the interconnect. The method can further include, in response to a connection pattern of the pseudo metal layer and the plurality of vias being compatible with respective routing properties, connecting the end of the extended TSV structure to the interconnect.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A structure, comprising:
a substrate comprising first and second surfaces;
a through-silicon-via (TSV) structure disposed in the substrate, wherein a first end portion of the TSV structure extends over the first surface of the substrate and a second end portion of the TSV structure extends below the second surface of the substrate;
a pseudo metal layer disposed on the first end portion of the TSV structure;
a via disposed on the pseudo metal layer;
a first interconnect structure disposed on the via; and
a second interconnect structure disposed on the second end portion of the TSV structure.

2. The structure of claim 1, wherein the pseudo metal layer is in contact with the first end portion of the TSV structure.

3. The structure of claim 1, wherein the pseudo metal layer is non-overlapping with the substrate.

4. The structure of claim 1, wherein a width of the pseudo metal layer is substantially equal to a width of the TSV structure.

5. The structure of claim 1, wherein the second interconnect structure is in contact with the second end portion of the TSV structure.

6. The structure of claim 1, further comprising an other pseudo metal layer disposed on the second end portion of the TSV structure.

7. The structure of claim 1, wherein a first end of the via is in contact with the pseudo metal layer and a second end of the via is in contact with the first interconnect structure.

8. The structure of claim 1, further comprising an other via disposed between the second interconnect structure and the second end portion of the TSV structure.

9. The structure of claim 1, further comprising an other via, wherein a first end of the other via is in contact with the second end portion of the TSV structure and a second end of the other via is in contact with the second interconnect structure.

10. The structure of claim 1, further comprising:
an other pseudo metal layer disposed on the second end portion of the TSV structure; and
an other via, wherein a first end of the other via is in contact with the other pseudo metal layer and a second end of the other via is in contact with the second interconnect structure.

11. A structure, comprising:
a semiconductor substrate;
a through-silicon-via (TSV) disposed in the semiconductor substrate;
a dummy metal layer disposed on and in contact with a first end surface of the TSV and is non-overlapping with the semiconductor substrate;
a first metal line disposed on a second end surface of the TSV;
a via disposed on and in contact with the dummy metal layer; and
a second metal line disposed on the via.

12. The structure of claim 11, wherein the dummy metal layer is separated from the semiconductor substrate by a portion of the TSV.

13. The structure of claim 11, wherein the first end surface of the TSV is non-coplanar with a top surface of the semiconductor substrate.

14. The structure of claim 11, further comprising an other dummy metal layer disposed between the TSV and the first metal line.

15. The structure of claim 11, further comprising a second via disposed between the second end surface of the TSV and the first metal line.

16. The structure of claim 11, wherein a width of the first metal line is greater than a width of the TSV; and
wherein the first metal line is in contact with the TSV.

17. A structure, comprising:
a substrate;
a through-silicon-via (TSV) disposed in the substrate, wherein a first portion of the TSV extends over a first surface of the substrate and a second portion of the TSV extends below a second surface of the substrate;
a via disposed on the first portion of the TSV;
a first interconnect structure disposed on the via; and
a second interconnect structure disposed on the second portion of the TSV.

18. The structure of claim 17, further comprising an other via disposed between the TSV and the second interconnect structure.

19. The structure of claim 17, wherein the second interconnect structure is in contact with the second portion of the TSV.

20. The structure of claim 17, further comprising a pseudo metal layer disposed between the via and the first portion of the TSV.

\* \* \* \* \*